United States Patent
King et al.

(10) Patent No.: US 7,592,809 B1
(45) Date of Patent: Sep. 22, 2009

(54) HYBRID K-T METHOD OF DYNAMIC IMAGING WITH IMPROVED SPATIOTEMPORAL RESOLUTION

(75) Inventors: Kevin F. King, New Berlin, WI (US); Dan Xu, Champaign, IL (US); Zhi-Pei Liang, Champaign, IL (US)

(73) Assignee: General Electric Company, Schenectady, NY (US)

( * ) Notice: Subject to any disclaimer, the term of this patent is extended or adjusted under 35 U.S.C. 154(b) by 861 days.

(21) Appl. No.: 11/287,184

(22) Filed: Nov. 23, 2005

(51) Int. Cl.
*G01V 3/00* (2006.01)
(52) U.S. Cl. ...................................... 324/309; 324/307
(58) Field of Classification Search .................. 324/309, 324/307
See application file for complete search history.

(56) References Cited

U.S. PATENT DOCUMENTS

| | | | |
|---|---|---|---|
| 6,784,664 B2* | 8/2004 | Liang et al. ................ | 324/309 |
| 7,053,613 B2* | 5/2006 | Lin ............................ | 324/307 |
| 7,154,268 B2* | 12/2006 | Kellman et al. ............. | 324/309 |
| 2006/0215891 A1* | 9/2006 | Fessler et al. ............... | 382/128 |
| 2007/0182412 A1* | 8/2007 | Katscher et al. ............. | 324/309 |
| 2008/0298661 A1* | 12/2008 | Huang ......................... | 382/131 |

OTHER PUBLICATIONS

Y. Sun, D. Yang, Q. Ye, M. Williams, J. M. F. Moura, F. Boada, Z.-P, Liang, and C. Ho, "Improved spatiotemporal resolution of USPIO-enhanced dynamic imaging of rat kidneys", *Magn. Reson. Imaging*, vol. 21, pp. 593-598, 2003.

Z.-P. Liang, H. Jiang, C. P. Hess, and P. C. Lauterbur, "Dynamic imaging by model estimation", *Int't J. Imag. Syst. Techn.*, vol. 8, pp. 551-557, 1997.

Z.-P. Liang and P. C. Lauterbur, "An efficient method for dynamic magnetic resonance imaging", *IEEE Trans. Med. Imag.*, vol. 13, pp. 677-686, Nov. 1994.

J. Tsao, B. Behnia, and A. G. Webb, "Unifying linear prior-information-driven methods for accelerated image acquisition", *Magn. Reson. Med.*, vol. 46, pp. 652-660, 2001.

G. McGibney, M. R. Smith, S. T. Nichols, and A. Crawley, "A quantitative evaluation of several partial Fourier reconstruction algorithms used in MRI", *Magn. Reson. Med.*, vol. 30, pp. 51-59, 1993.

R. A. Jone, O. Haraldseth, T.B. Muller, P. A. Rinck, and A. N. Oksendal, "k-space substitution: A novel dynamic imaging technique", *Magn. Reson. Med.*, vol. 29, pp. 830-834, 1993.

D. K. Sodickson and W. J. Manning, "Simultaneous acquisition of spatial harmonics (SMASH): Fast imaging with radiofrequency coil arrays", *Magn. Reson. Med.*, vol. 38, pp. 591-603, Oct. 1997.

(Continued)

*Primary Examiner*—Louis M Arana
(74) *Attorney, Agent, or Firm*—Ziolkowski Patent Solutions Group, SC

(57) ABSTRACT

Variable-density (VD), sequentially-interleaved sampling of k-space coupled with the acquisition of reference frames of data is carried out to improve spatiotemporal resolution, image quality, and signal-to-noise ratio (SNR) of dynamic images. In one example, ktSENSE is implemented with a non-static regularization image, such as that provided by RIGR or similar technique, to acquire and reconstruct dynamic images. The integration of ktSENSE and RIGR, for example, provides dynamic images with higher spatiotemporal resolution and lower image artifacts compared to dynamic images acquired and reconstructed using ktSENSE alone.

20 Claims, 8 Drawing Sheets

OTHER PUBLICATIONS

K. P. Pruessmann, M. Weiger, M. B. Scheidegger, and P. Boesiger, "SENSE: Sensitivity encoding for fast MRI", *Magn. Reson. Med.*, vol. 42, pp. 952-962, 1999.

B. Madore, G. H. Glover, and N. J. Pelc, "Unaliasing by Fourier-encoding the overlaps using the temporal dimension (UNFOLD), applied to cardiac imaging and fMRI", *Magn. Reson. Med.*, vol. 42, pp. 813-828, 1999.

P. Kellman, F. H. Epstein, and E. R. McVeigh, "Adaptive sensitivity encoding incorporating temporal filtering (TSENSE)", *Magn. Reson. Med.*, vol. 45, pp. 846-852, 2001.

B. Madore, "Using UNFOLD to remove artifacts in parallel imaging and in partial-Fourier imaging",*Magn. Reson. Med.*, vol. 48, pp. 493-501, 2002.

B. Madore, "UNFOLD-SENSE: A parallel MRI method with self-calibration and artifact suppression", *Magn. Reson. Med.*, vol. 52, pp. 310-320, 2004.

F. A. Breuer, P. Kellman, M. A. Griswold, and P. M. Jakob, "Dynamic autocalibrated parallel imaging using temporal GRAPPA (TGRAPPA)", *Magn. Reson. Med.*, vol. 53, pp. 981-985, 2005.

J. Tsao, P. Boesiger, and K. P. Pruessmann," k-t BLAST and k-t SENSE: Dynamic MRI with high frame rate exploiting spatiotemporal correlations", *Magn. Reson. Med.*, vol. 50, pp. 1031-1042, 2003.

Z.-P. Liang, B. Madore, G. H. Glover, and N. J. Pelc, "Fast algorithms for GS-model-based image reconstruction in data-sharing Fourier imaging", *IEEE Trans. Med. Imag.*, vol. 22, pp. 1026-1030, Aug. 2003.

J. M. Hanson, Z.-P. Liang, E. C. Wiener, and P. C. Lauterbur, "Fast dynamic imaging using two reference images", *Magn. Reson. Med.*, vol. 36, pp. 172-175, 1996.

Y. Sun, D. Yang, Q. Ye, M. Williams, J. M. F. Moura, F. Boada, Z.-P. Liang, and C. Ho, "Improved spatiotemporal resolution of USPIO-enhanced dynamic imaging of rat kidneys", *J. Magn. Reson. Imaging*, vol. 21, pp. 593-598, 2003.

Z.-P. Liang, A. Stenger, J. X. Ji, J. Ma, and F. Boada, "Parallel generalized series imaging", in *Proc. 11th Ann. Meet. Intl. Soc. Mag. Reson, Med.*, pp. 2341, Toronto, Ontario, Canada, Jul. 2003.

S. Kozerke, J. Tsao, R. Razavi, and P. Boesiger, "Accelerating cardiac cine 3D imaging using k-t BLAST", *Magn. Reson. Med.*, vol. 52, pp. 19-26, 2004.

J. Tsao, S. Kozerke, P. Boesiger, and K. P. Pruessmann, "Optimizing spatiotemporal sampling for k-t BLAST and k-t SENSE: Application to high-resolution real-time cardiac steady-state free precession", *Magn. Reson. Med.*, vol. 53, pp. 1372-1382, 2005.

S. Kozerke, J. Tsao, R. Hoogeveen, J. Puginier, P. Boesiger, and K. U. Wentz, "Accelerating time-resolved 3D contrast-enhanced angiography using k-t BLAST", in *Proc. 13th Ann. Meet. Intl. Soc. Mag. Reson. Med.*, pp. 382, Miami, Florida, May 2005.

C. Baltes, S. Kozerke, M. S. Hansen, K. P. Pruessmann, J. Tsao, and P. Boesiger, "Considerations on training data in k-t BLAST/k-t SENSE accelerated quantitative flow measurements", in *Proc. 13th Ann. Meet. Intl. Soc. Mag. Reson. Med.*, pp. 383, Miami, Florida, May 2005.

H. Eggers, J. Tsao, S. Weiss, A. Buecker, M. Katoh, K. P. Pruessmann, and P. Boesiger, "Application of k-t BLAST to passive catheter tracking: Initial evaluation in-vivo", in *Proc. 13th Ann. Meet. Intl. Soc. Mag. Reson. Med.*, pp. 953, Miami, Florida, May 2005.

C. A. McKenzie, E. N. Yeh, M. A. Ohliger, M. D. Price, and D. K. Sodickson, "Self-calibrating parallel imaging with automatic coil sensitivity extraction", *Magn. Reson. Med.*, vol. 47, pp. 529-538, 2002.

M. Weiger, K. P. Pruessmann, and P. Boesiger, "Cardiac real-time imaging using SENSE", *Magn. Reson. Med.*, vol. 43, pp. 177-184, 2000.

S. Plein, A. Radjenovic, J. P. Ridgway, D. Barmby, J. P. Greenwood, S. G. Ball, and M. U. Sivananthan, "Coronary artery disease: Myocardial perfusion MR imaging with sensitivity encoding versus conventional angiography", *Radiology*, vol. 235, pp. 423-430, May 2005.

K. F. King, "Efficient variable density SENSE reconstruction", in *Proc. 13th Ann. Meet. Intl. Soc. Mag. Reson. Med.*, pp. 2418, Miami, Florida, May 2005.

M. A. Griswold, P. M. Jakob, R. M. Heidemann, M. Nittka, V. Jellus, J. Wang, B. Kiefer, and A. Haase, "Generalized autocalibrating partially parallel acquisitions (GRAPPA)", *Magn. Reson. Med.*, vol. 47, pp. 1202-1210, 2002.

* cited by examiner

HYBRID K-T METHOD OF DYNAMIC IMAGING WITH IMPROVED SPATIOTEMPORAL RESOLUTION

BACKGROUND OF THE INVENTION

The present invention relates generally to magnetic resonance (MR) imaging and, more particularly, to a method of MR imaging using parallel imaging reconstruction buttressed by a non-static regularization image to improve spatiotemporal resolution of dynamic images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_0$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct an image.

Dynamic imaging, which is directed to the acquisition of images from objects in motion, is increasingly being used for cardiac imaging, contrast-enhanced dynamic studies, and functional imaging. With conventional dynamic imaging protocols, frames of data are acquired and individually reconstructed to form a series of images which collectively show motion within the region-of-interest from which the data was collected. Ideally, it is desirable to acquire each temporal frame with fully encoded samples to achieve high spatial resolution; however, acquiring such fully sampled frames would require excessive acquisition times thereby negatively affecting the temporal resolution of the data acquisition. Therefore, to improve the spatial resolution without significantly affecting temporal resolution of dynamic images, a number of dynamic acquisition techniques have been developed.

Generally, these proposed dynamic imaging techniques undersample k-space to reduce data collection time for each temporal frame. The techniques then use inherent spatial (k-space or image space) and/or temporal correlations among the samples to recover unsampled data. These techniques are generally classified into one of two categories: parametric and nonparametric. Those techniques that utilize a parametric model include Dynamic Imaging by Model Estimation (DIME), Reduced-encoding Imaging by Generalized-series Reconstruction (RIGR), and Broad-use Linear Acquisition Speed-up Technique (BLAST). Nonparametric techniques include partial Fourier imaging, keyhole imaging, parallel imaging, and UNaliasing by Fourier-encoding the Overlaps using the temporaL Dimension (UNFOLD). Parallel imaging, which is independent of other techniques, is increasingly being used in combination with other imaging techniques to provide further improvement in spatiotemporal resolution. These combinations include TSENSE, UNFOLD-SENSE, TGRAPPA, and ktBLAST/ktSENSE.

While these proposed techniques have been effective in improving spatiotemporal resolution of dynamic images, the techniques do have some drawbacks. For example, RIGR, which provides the advantage of capturing dynamic information with efficient representation, assumes that changes between acquired reference frames and dynamic references have low spatial resolution and can be acquired by central dynamic encodings. As a result, with the RIGR technique, new dynamic features or sharp changes between frames must have low spatial resolution and, thus, potentially mask diagnostically valuable information.

Similarly, the parallel imaging technique ktBLAST/ktSENSE also suffers from some drawbacks. (Because ktBLAST is the single channel version of ktSENSE, reference to ktSENSE shall include ktBLAST.) The ktSENSE technique utilizes a static regularization image. Specifically, ktSENSE uses a temporal average (DC) term which, as a result, can decrease the temporal resolution of the ktSENSE images significantly. Moreover, because ktSENSE uses training data that is acquired with a pre-scan, it is possible for misregistration to occur between training data and imaging data during synchronization of the training and imaging data. This can introduce additional errors into the ktSENSE images. Notwithstanding these drawbacks, ktSENSE is effective in acquiring data with high temporal resolution through the undersampling of phase encodings with a given reduction factor for each temporal frame. KtSENSE also is efficient in recapturing the true signal from aliased signals.

It would therefore be desirable to have a data acquisition and reconstruction process that carries out ktSENSE or other similar parallel imaging technique with a non-static regularization image, such as that generated by RIGR, to provide dynamic images with improved spatiotemporal resolution.

BRIEF DESCRIPTION OF THE INVENTION

The present invention provides a system and method of dynamic imaging with improved spatiotemporal resolution that overcomes the aforementioned drawbacks.

Variable-density (VD), sequentially-interleaved sampling of k-space coupled with the acquisition of reference frames of data is carried out to improve spatiotemporal resolution, image quality, and signal-to-noise ratio (SNR) of dynamic images. In one example, ktSENSE is implemented with a non-static regularization image, such as that provided by RIGR or similar technique, to acquire and reconstruct dynamic images. The integration of ktSENSE and RIGR, for example, provides dynamic images with higher spatiotemporal resolution and lower image artifacts compared to dynamic images acquired and reconstructed using ktSENSE alone.

Therefore, in accordance with one aspect of the present invention, a method of dynamic MR imaging is disclosed that includes the step of acquiring frames of MR data containing dynamic imaging data and reference data with an array of receive coils. The method further includes the step of generating a non-static regularization image with a regularization reconstruction from the reference data and selected portions of the dynamic imaging data. An image is then reconstructed from the dynamic imaging data with a parallel imaging reconstruction using the non-static regularization image to improve spatiotemporal resolution of the reconstructed image.

In accordance with another aspect, the invention includes a computer readable storage medium having a computer program stored thereon to reconstruct an MR image. The computer program represents a set of instructions that when executed by a computer causes the computer to decompose the VD, sequentially-interleaved data with references into a plurality of sets. The set of instructions further causes the computer to generate a coil sensitivity image from a first set of data and generate a non-static regularization image with a second set of data and the coil sensitivity image. The computer is further caused to determine an energy distribution of true signal for unaliasing in a y-f domain from a third set of data and the non-static regularization image.

According to yet a further aspect of the present invention, an MR imaging apparatus is disclosed as having a plurality of gradient coils positioned about a bore of a magnet configured to impress a polarizing magnetic field and a RF receiver system and an RF switch controlled by a pulse module to transmit RF energy to an RF coil assembly to acquire MR images. The apparatus further includes a computer that is programmed to sample frames of MR data acquired over time with the RF coil assembly and generate a $k_x,k_y,t$ space from the sampled frames. The computer is also programmed to generate a RIGR regularization image from the $k_x,k_y,t$ space and reconstruct an image with high spaciotemporal resolution from the frames of MR data with a ktSENSE reconstruction using the RIGR regularization image.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
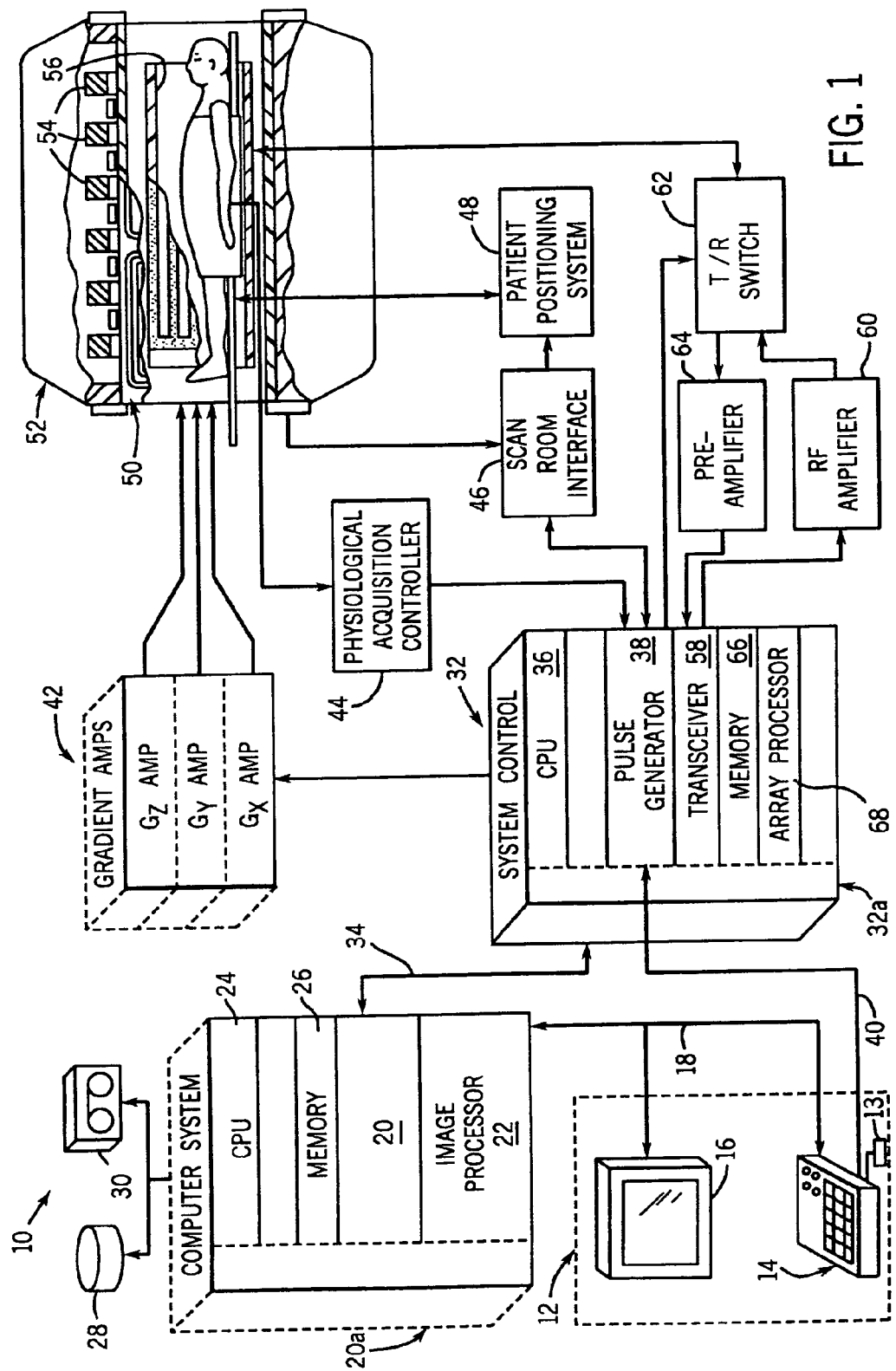
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. It is contemplated that RF coil 56 may also be a phased coil array such as CTL coil or a head coil. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The invention is directed to the acquisition and reconstruction of dynamic images using the MRI system illustrated in FIG. 1, or equivalents thereof. In one exemplary embodiment, the invention integrates ktSENSE and RIGR reconstruction techniques to acquire and reconstruct dynamic images with high spatiotemporal resolution, reduced artifacts, and increased SNR. It is contemplated, however, that the invention may be applicable for other parallel imaging and regularization techniques. Moreover, while the invention will be described with respect 2D imaging, it is contemplated that the invention can be adopted for 3D imaging.

Generally, ktSENSE is a parallel imaging technique similar to SENSE that acquires undersampled phase encodings with a given reduction factor for each temporal frame, while sequentially interleaving the sampling location. This is in contrast to the non-interleaved sampling pattern used in SENSE. The result of this interleaved k-t sampling pattern is a sheared point spread function where the centers of the aliasing lie on diagonal locations in the y-f domain (where f corresponds to the temporal frequency). The y-f domain is the reciprocal of the k-t domain. For a typical spectrum, e.g., spectrum of cardiac imaging, this aliasing pattern gives rise to more scattered aliasing signals, less overlaps, and more efficient use of y-f domain than that of SENSE. The true signal is therefore easier to retrieve from the aliased signals. Further, an energy distribution is learned from training data that is also acquired during the acquisition of the dynamic images. Conventional ktSENSE however utilizes a static regularization image.

Therefore, in one example, the invention integrates ktSENSE with a regularization technique that yields a non-static regularization image. In one example, that regularization technique is RIGR. With RIGR, one or multiple sets of full phase encodings (PEs) are acquired as reference images, and a series of central PEs are acquired for dynamic images. For a 1D expression, the qth dynamic image $\rho_q(x)$ is efficiently represented as a generalized series expansion:

$$\rho_q(x) = \sum_{n=-M/2}^{M/2-1} c_n \varphi_n(x), \quad \text{(Eqn. 1)}$$

where M is the number of dynamic encodings, $c_n$ are series coefficients, and $\varphi_n(x)$ are basis functions that absorb prior information contained in a reference image. One way to construct $\varphi_n(x)$ is through contrast modulation:

$$\varphi_n(x) = [|\rho_{ref}(x)| + \mu] e^{i2\pi n \Delta kx} \quad \text{(Eqn. 2),}$$

where $\rho_{ref}(x)$ is the reference image and $\mu$ is a regularization parameter. Combining Eqns. 1-2 approximately maximizes cross-entropy between reference and dynamic images. An advantage of RIGR is that the generalized series model (Eqn. 1) captures dynamic information with efficient representation, thereby requiring smaller number of dynamic encodings. Conventional RIGR however assumes that changes between the acquisition of reference and dynamic frames are of low spatial resolution.

Figure 2:
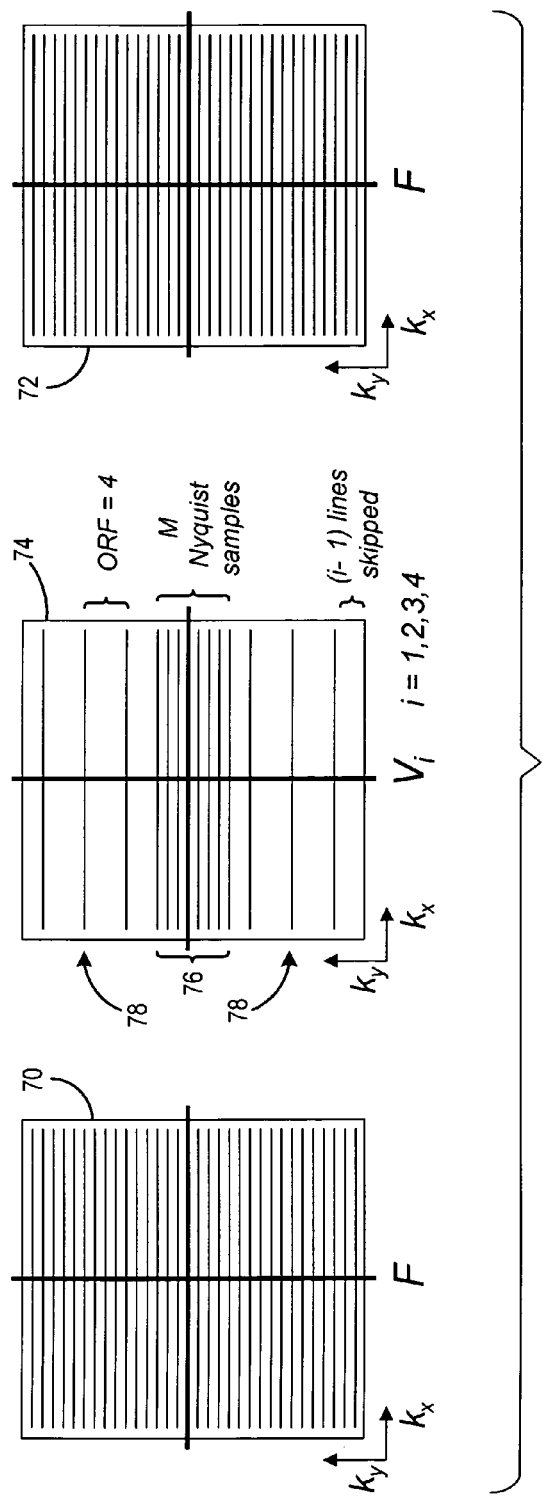
FIG. 2 schematically illustrates k-space for series of acquisition frames according to an embodiment of the present invention.

Thus, according to an embodiment of the invention, RIGR and ktSENSE are integrally combined. In this regard and referring to FIG. 2, MR data is acquired according to a VD, sequentially-interleaved sampling pattern with references. In one example, two reference frames 70, 72 that are fully sampled with thirty-two PEs are acquired as are a series of undersampled dynamic frames 74 which are acquired between acquisition of the reference frames 70, 72. The undersampled frames 74 are characterized by a variable undersampling factor. In one example, the outer phase encoding locations 78 are undersampled by a given outer reduction factor (ORF) whereas the central phase encoding locations 76 are fully sampled with Nyquist spacing. In one example, the outer phase encoding locations are sequentially interleaved by starting with the ith phase encoding line for $V_i$, i=1, 2, 3, 4 for an ORF of four. For example, $V_1$ samples lines 1, 5, 9, 13, ..., $V_2$ samples lines 2, 6, 10, 14, ..., etc. In FIG. 2, a 2D acquisition of dynamic data $(k_y, k_x, t)$ is assumed with the readout direction assumed to be $k_x$, which is fully sampled, and the PE direction is assumed to be $k_y$, which may be undersampled, as described above.

Figure 3:
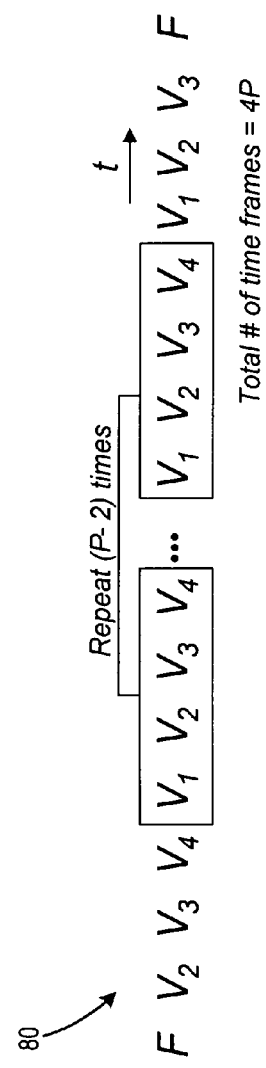
FIG. 3 illustrates the acquisition sequence for acquiring the acquisition frames schematically illustrated in FIG. 2.

Referring now to FIG. 3, an acquisition sequence 80 consistent with the VD, sequentially-interleaved acquisition process described with respect to FIG. 2 is illustrated. As shown, the sequence 80 is book-ended by a pair of reference frames, F. Between acquisition of the reference frames, dynamic frames, $V_i$, are acquired with VD, sequentially-interleaved sampling. In the illustrated example, an ORF of four is used and the total number of frames equals 4P, where P is determined by the total imaging time of the actual experiment. Further, in the illustrated example, the $\{V_1, V_2, V_3, V_4\}$ pattern is repeated P-2 times during the acquisition of the dynamic frames.

Figure 4:
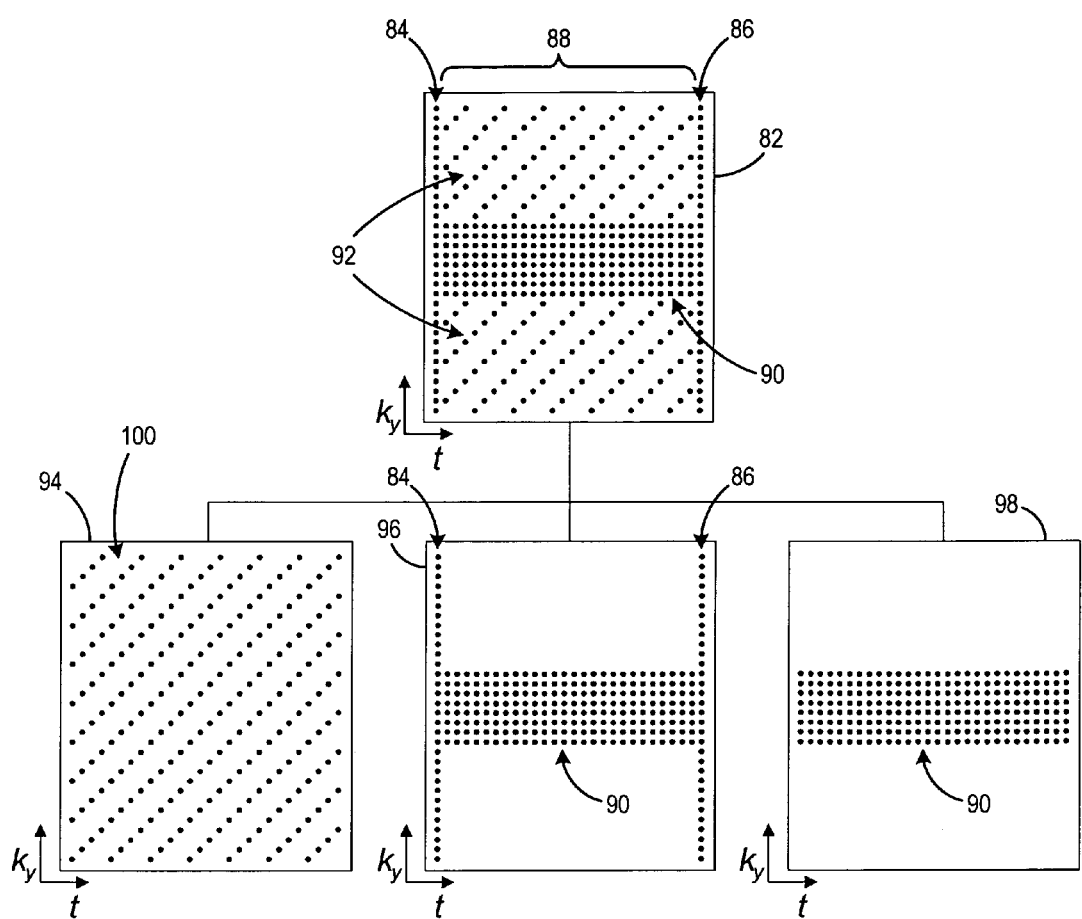
FIG. 4 illustrates decomposition of acquired frames of MR data into an unaliasing set, a regularization set, and training set according to an embodiment of the present invention.

Referring now to FIG. 4, to facilitate high spatiotemporal image reconstruction, the acquired frames are decomposed into three sets. The acquired data, which includes reference and dynamic frames, is illustrated in the $k_y$-t space 82. (For purpose of simplicity, the $k_x$ (readout) dimension is not shown; however a skilled artisan would understand that the $k_x$ dimension extends orthogonal to the $k_y$ dimension and thus would extend out of the page.) As illustrated, the first and the last frames 84, 86 are fully encoded the phase encoding dimension. Between the reference frames is illustrated the VD, sequentially-interleaved sampling of the dynamic frames 88. The central PEs 90 are sampled with Nyquist sampling and the outer PEs 92 are sampled according to the VD, sequentially-interleaved pattern.

$K_y$-t space 82 is decomposed into an unaliasing set 94, a RIGR set 96, and a training set 98. As will be described, each set 94, 96, 98 will be used to perform different functions of the image reconstruction process to yield an image with high spatiotemporal resolution. The unaliasing set, $d_U$, 94 is comprised of data from the sequentially-interleaved sampling PE locations of $k_y$-t space 82. This is illustrated by the series of diagonally extending data points 100. The unaliasing set 94 is used to provide data for unaliasing the acquired dynamic data in the y-f domain. The RIGR set, $d_R$, 96 comprises the two fully sampled reference frames 84, 86 as well as the central dynamic encodings 90 that were sampled with Nyquist spacing. The RIGR set 96 will be used to reconstruct a non-static regularization image. The training set, $d_T$, 98 is comprised of the center dynamic encodings 90 and will be used as training data to estimate energy distribution of the reconstruction for recovery of the true signal from the $k_y$-t space 82.

In contrast to conventional ktSENSE, the invention integrates the training stage into the data acquisition process thereby eliminating misregistration that is typically encountered with ktSENSE and other parallel imaging techniques with an acceptable increase in acquisition time. Also, the central PEs 90 enable the reconstruction of high temporal images with the RIGR reconstruction process, which is integrated with the parallel imaging reconstruction i.e. ktSENSE, for improved temporal resolution. The central PEs 90 can also be utilized to improve SNR and enable self-calibration when desired. It is noted that the reference frames 84, 86 are acquired before and after acquisition of the dynamic frames 88, thus, the reference frame acquisitions 84, 86 do not affect the acquisition time of the dynamic frames 88.

As will be described in further detail below, the invention includes an image reconstruction process containing multiple loops for processing the sets of MR data 94, 96, 98. As will be described, the image reconstruction process includes a loop for estimating sensitivity functions, i.e., coil sensitivity, a regularization image reconstruction loop, a loop for estimating energy distribution in the y-f domain, and an unaliasing loop in the y-f domain.

Figure 5:
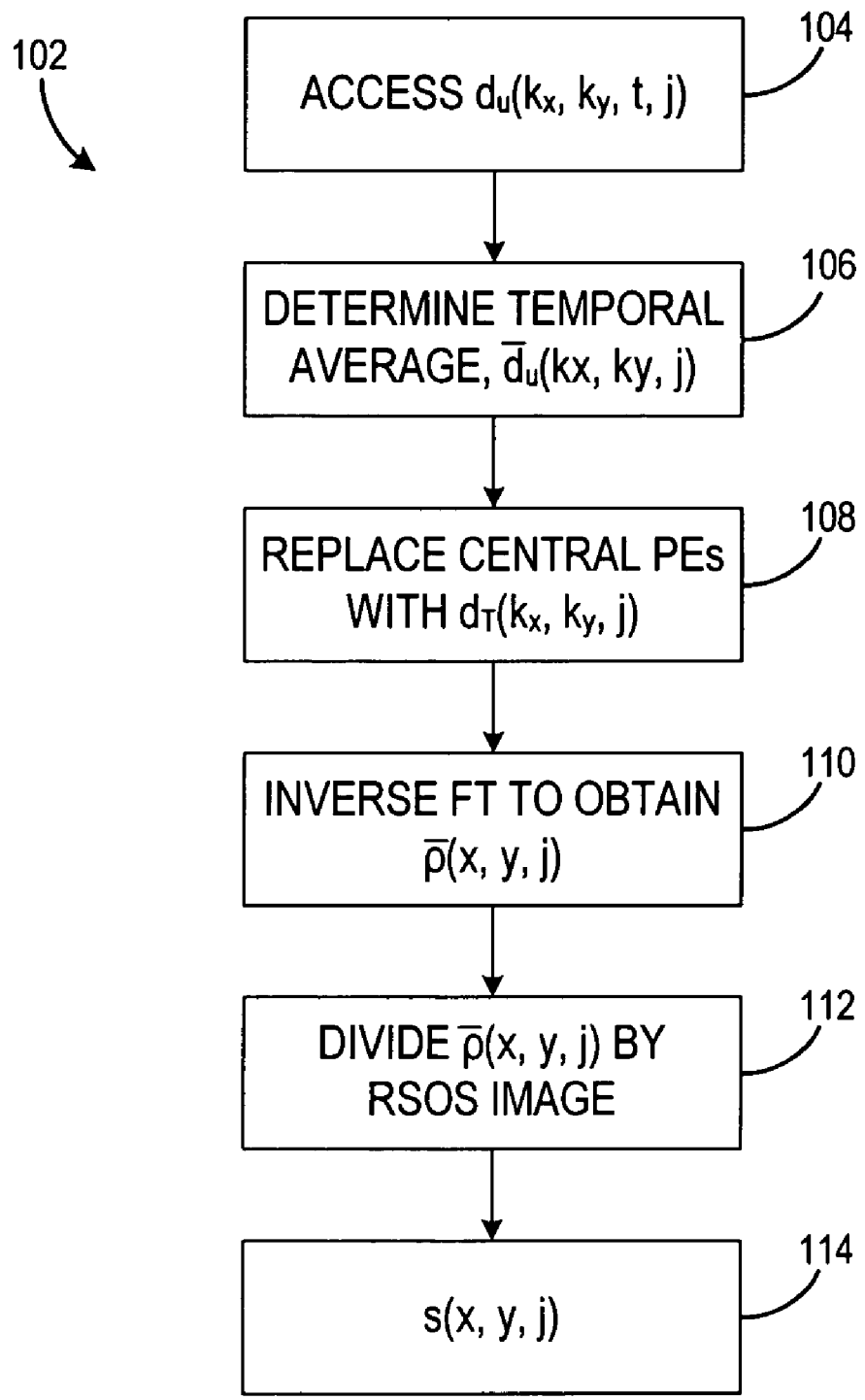
FIG. 5 sets forth the steps of estimating sensitivity functions according to an aspect of the present invention.

Referring now to FIG. 5, the steps of an estimating sensitivity functions loop 102 according to an embodiment of the invention are shown. Loop 102 begins with accessing at 104 the unaliasing set, $d_U(k_x,k_y,j)$ where j represents the jth coil. As the MR data is preferably acquired with a coil array having a number of coils, the data from each coil is initially processed independently and then combined. As illustrated in FIG. 4, the acquired data is decomposed into three sets $d_U$, $d_R$ and $d_T$. When estimating sensitivity functions the unaliasing set, $d_U(k_x,k_y,j)$ is primarily used. Because of the interleaved sampling pattern, a temporal average of du gives full $k_x,k_y$ sampling for each coil j. A temporal average is performed on $d_U(k_x,k_y,t,j)$ at 106, to synthesize a full-resolution dataset, $\bar{d}_U(k_x,k_y,j)$, which has good SNR when the number of frames is large, e.g., 32. The center portion of this full-resolution dataset is then replaced at 108 with the temporal average of the training set, $\bar{d}_T(k_x,k_y,t,j)$, which yields $\bar{d}(k_x,k_y,j)$ having increased SNR. Inverse Fourier transform (FT) is carried out at 110 to obtain sensitivity-weighted images $\bar{\rho}(x,y,j)$, which are then divided by their root-sum-of-squares (RSOS) image 112 to estimate the sensitivity functions s(x,y,j) 114 where $$RSOS(x, y) = \sqrt{\sum_j |\bar{\rho}(x, y, j)|^2}.$$

In many cases, these sensitivity functions are sufficient to get reconstructions with reasonable SNR. In cases the sensitivity functions are very noisy, polynomial fitting and other post-processing correction methods can be used. When sensitivity functions change significantly over time, they can be estimated based on self-calibration using the center dynamic encodings 90, FIG. 4. The reference images are fully sampled, and therefore can also be used to estimate sensitivity functions.

Figure 6:
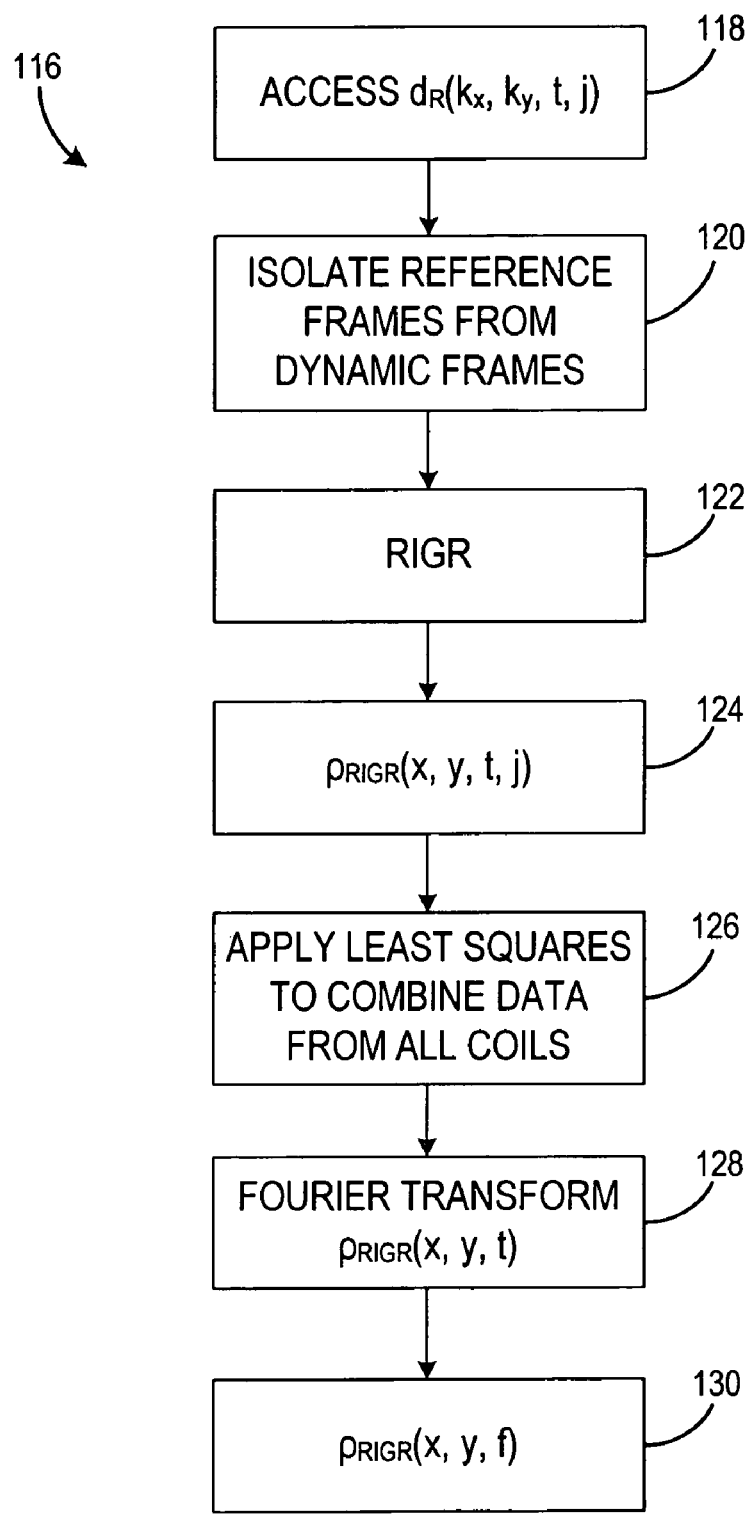
FIG. 6 sets forth the steps of a regularization image reconstruction process according to an embodiment of the present invention.

Referring now to FIG. 6, the reconstruction process also includes a process loop 116 for reconstructing a non-static regularization image. In one example, two-reference RIGR is performed on $d_R(k_x,k_y,t,j)$ to reconstruct a series of sensitivity-weighted high temporal resolution images. In this regard, the RIGR set is processed to isolate the reference frame data and the dynamic frame data from one another 120. RIGR is then preformed 122 to yield $\rho_{RIGR}(x,y,t,j)$ 124. Specifically, each reconstruction $\rho_{RIGR}(x,y,t,j)$ is a sum of the baseline image (the first reference image) and a difference image $\Delta\rho(x,y,t,j)$, where:

$$\Delta\rho(x, y, t, j) = [|\Delta\rho_{ref}(x, y, j)| + \mu] \sum_{n=-M/2}^{M/2-1} c_n e^{i2\pi n \Delta x}, \quad \text{(Eqn. 3)}$$

with $\Delta\rho_{ref}(x,y,j)$ being the difference image generated by subtracting the first reference from the second reference. As MR data is acquired with a plurality of coils, coefficients $c_n$ in Eqn. 3 are determined for all locations of x and all coils by enforcing data consistency at the center phase encodings according to the following expression:

$$\Delta d(x, m, t, j) = \sum_{n=-M/2}^{M/2-1} c_n \Delta d_{ref}(x, m-n, j), \quad \text{(Eqn. 4)}$$

where $\Delta d(x,m,t,j)$ is obtained by subtracting center encodings of the first reference data from center encodings at dynamic frames, followed by inverse FT on $k_x$, and $\Delta d_{ref}(x,m,j)$ is the FT of $\Delta\rho_{ref}(x,y,j)$ on y. Linear Eqn. 4 is solved for $c_n$ using matrix inversion or other fast algorithm. Such algorithms are well known to those skilled in the art. After $c_n$ are solved, the difference image $\Delta\rho(x,y,t,j)$ is obtained using Eqn. 3 and added back to the baseline image to get $\rho_{RIGR}(x,y,t,j)$. Sensitivity weighting is removed by combining coils from $\rho_{RIGR}(x,y,t,j)$ by applying a least-squares (LS) solution 126:

$$\rho_{RIGR}(x, y, t) = \frac{\sum_j \rho_{RIGR}(x, y, t, j) s^*(x, y, j)}{\sum_j s(x, y, j) s^*(x, y, j)}, \quad \text{(Eqn. 5)}$$

where "*" represents complex conjugation. FT along temporal axis on $\rho_{RIGR}(x,y,t)$ is performed 128 to obtain spectrum $\rho_{RIGR}(x,y,f)$ 130, which will be used as a regularization image during reconstruction.

Figure 7:
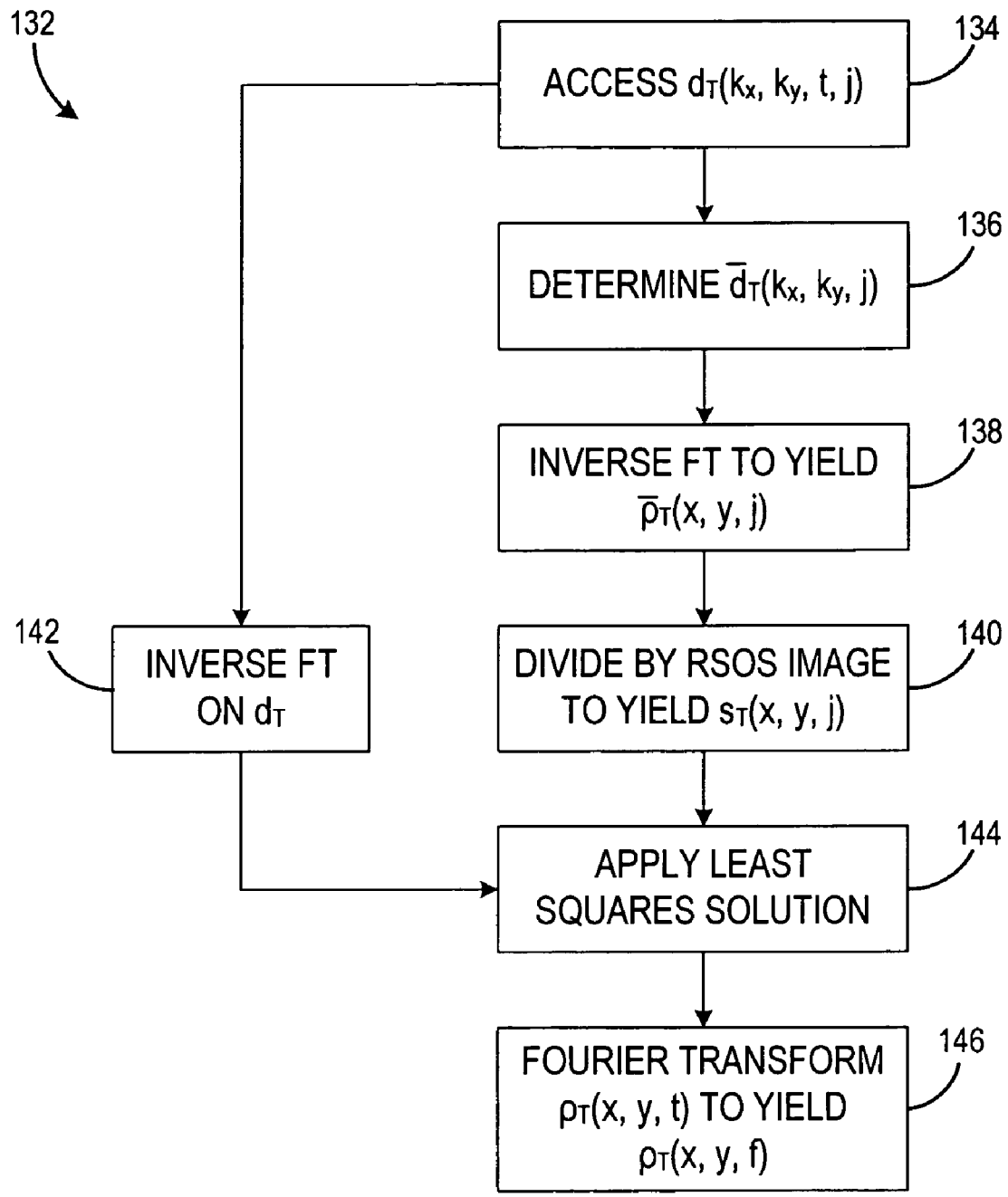
FIG. 7 sets forth the steps of an energy distribution estimation process according to an embodiment of the present invention.

The reconstruction process also includes a loop for estimating energy distribution in the y-f domain, as illustrated in FIG. 7. The purpose of this loop 132 of the reconstruction process is to determine the energy distribution of true signal to guide unaliasing in the y-f domain. In this regard, the training set of $d_T(k_x,k_y,t,j)$ is accessed at 134. Low-resolution functions are determined from $d_T(k_x,k_y,t,j)$ using temporal average $\bar{d}_T(k_x,k_y,t)$ 136, inverse FT to obtain $\bar{\rho}_T(x,y,j)$ 138, and then divided by RSOS image 140 to yield $s_T(x,y,j)$ where RSOS is now $$RSOS(x, y) = \sqrt{\sum_j |\bar{\rho}_T(x, y, j)|^2}.$$

An inverse FT 142 is also performed to transform $d_T(k_x,k_y,t,j)$ to image domain $\rho_T(x,y,t,j)$, followed by removal of the sensitivity weighting $s_T(x,y,j)$ using a least-squares solution 144, similar to Eqn. 5. The resulting image sequence $\rho_T(x,y,t)$ is then Fourier transformed 146 along the temporal axis to get a low spatial resolution spectrum $\rho_T(x,y,f)$. In one example, the unaliasing process takes the form of a Tikhonov regularization, where the energy distribution predictor is in a differential form:

$$e^2(x,y,f)=|\rho_T(x,y,f)-\rho_{RIGR}(x,y,f)|^2 \quad \text{(Eqn. 6)}$$

It should be noted that there is no misregistration issue because the low resolution data is collected along with the imaging data.

Figure 8:
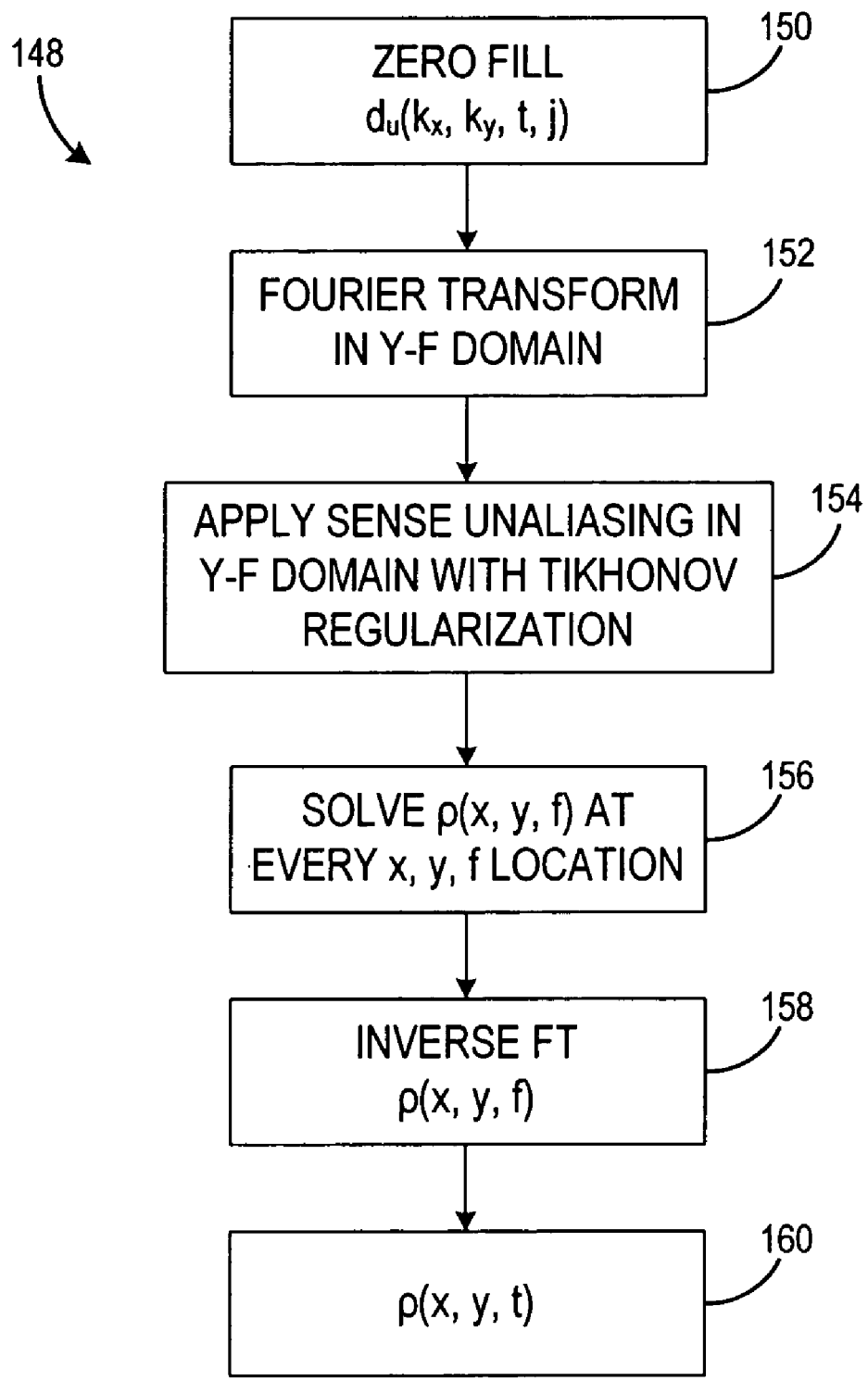
FIG. 8 sets forth the steps of an unaliasing process according to another embodiment of the present invention.

Referring now to FIG. 8, the reconstruction process concludes with unaliasing in the y-f domain 148. Accordingly, The undersampled data $d_U(k_x,k_y,t,j)$ are first zero-filled 150 in the non-acquired PE locations and then FT 152 to the y-f domain to obtain the aliased spectrum $\rho_{alias}(x,y,f,j)$. Then SENSE unaliasing in the y-f domain with Tikhonov regularization is performed at 154 to recover the desired signal. Specifically:

$$\rho=\rho_{RIGR}+E^2S^H(SE^2S^H+\psi)^{-1}(\rho_{alias}-S\rho_{RIGR}) \quad \text{(Eqn. 7)}$$

is used for an underdetermined system (number of coils≦ORF), and:

$$\rho=\rho_{RIGR}+(S^H\psi^{-1}S+E^{-2})^{-1}S^H\psi^{-1}(\rho_{alias}-S\rho_{RIGR}) \quad \text{(Eqn. 8)}$$

is used for an overdetermined system (number of coils>ORF), for each (x,y,f) location. In Eqns. 7-8, $\rho$ is a vector that groups true image spectrum intensities (not sensitivity weighted) from locations that are aliased at (x,y,f), $\rho_{RIGR}$ is similar except that it groups RIGR image spectrum, $\rho_{alias}$ is a vector that groups the aliased intensities (sensitivity weighted) at (x,y,f) from all coils, S is the sensitivity matrix in x-y-f domain, $\psi$ is the noise correlation matrix, and $E^2$ is a diagonal matrix consisting of the difference energy distribution in Eqn. 6 at all locations that are aliased at (x,y,f). $\psi$ is a square Hermitian matrix that describes the correlation of noise from every coil element to every other coil element. In regularization terminology, $E^2$ is called a regularization parameter, which brings prior knowledge of the true images (energy distribution) into reconstruction process and improves conditioning of the matrix system; $\rho_{RIGR}$ is called the regularization term, which can also bring prior information of the true images into the unaliasing process to improve quality of reconstruction. After $\rho(x,y,f)$ is solved at every (x,y,f) location 156, it is then inverse Fourier transformed at 158 back to time domain to get the final reconstructed image 160.

The present invention provides a number of advantages over known dynamic imaging techniques. A general comparison of the present invention to other dynamic imaging techniques will now be provided.

One proposed solution for improving spatiotemporial resolution in dynamic imaging is the sliding window technique. The $k_y$-t sampling pattern for the sliding window technique is to undersample in $k_y$ and sequentially interleave in t. The reconstruction process copies PE lines from neighboring time frames to fill in unacquired lines, therefore synthesizing a full set of PEs for each time point at each coil. This full data set is then Fourier transformed to image domain and sensitivity weighting is removed by RSOS or LS estimation.

While the sliding window reconstruction process is relatively fast, the temporal resolution, however, is low because copying phase encodings from neighbor frames is equivalent to local temporal averaging, which reduces temporal resolution significantly. Images produced by the present invention have much higher temporal resolution than that achieved by the sliding window technique.

Cartesian SENSE is frequently used for dynamic imaging applications. Cartesian SENSE uses the same undersampling pattern (i.e. one that is not interleaved in $k_y$ and t) for each temporal frame. In image reconstruction, k-space data is first Fourier transformed to image domain to form a sequence of aliased images, and SENSE reconstruction is then performed for each temporal frame independently to unalias true images.

Cartesian SENSE reconstruction like sliding window is relatively fast; however, Cartesian SENSE does not take advantage of signal correlation along the temporal axis. As aliased copies of spectra usually have more overlap when the SENSE sampling pattern is used than when the sampling pattern of the present invention is used, SENSE unaliasing is therefore susceptible to lower SNR. Furthermore, unlike the present invention, SENSE does not use a Tikhonov regularization framework in reconstruction, which degrades conditioning of the matrix equations in the SENSE technique. Although SENSE can also be modified to use regularization, SENSE must acquire separate data for regularization images, while the regularization images are directly derived from the acquired data in the present invention.

UNFOLD is another proposed technique. Data acquisition with UNFOLD is similar to that of sliding window. In the y-f domain, this leads to aliasing. When a reduction factor of two is used, the sampling pattern equivalently shifts the DC term of the aliased copy to the Nyquist frequency. Lowpass filtering is then applied along the f domain to eliminate aliasing at the Nyquist frequency, which recovers the unaliased images. Images from different coils are combined using RSOS.

UNFOLD is a generally fast technique that exploits correlation along the temporal axis. However, UNFOLD requires that aliased copies in y-f domain do not overlap, which normally holds only for reduction factor of two for cardiac imaging. Furthermore, width of the filter used in UNFOLD should ideally be spatially-dependent, because the width of f spectrum at different y locations is different. In practice, however, a fixed-sized filter is used, which can either over-filter or under-filter aliasing at certain locations. Typically, UNFOLD reconstructions have remaining aliasings due to improper filtering, especially at relatively static locations that overlap with relatively dynamic locations. The present invention, however, allows overlap in the y-f domain. In this regard, the present invention is more general and can achieve a higher reduction factor than UNFOLD without compromising spatiotemporal resolution.

TSENSE uses the same data acquisition protocol as sliding window. TSENSE generally consists of two steps. First, a SENSE reconstruction is performed at each temporal frame. Second, UNFOLD is applied to the SENSE reconstruction series to remove remaining aliasing artifacts and reduce noise.

With TSENSE, SENSE is applied as a spatial filter and UNFOLD is applied as a separate temporal filter. SENSE plays a leading role in reconstruction and directly contributes to the reduction factor, whereas UNFOLD is only used to reduce remaining aliasing artifacts and does not directly increase the reduction factor. The effectiveness of UNFOLD is rather limited in TSENSE because artifacts due to SENSE ill-conditioning are typically coherent along t (low temporal frequency), which remain in the final reconstructed image. Contrastingly, the present invention uses spatial and temporal filters in one integrated framework and therefore yields better reconstruction.

Two UNFOLD-SENSE methods have been proposed. To distinguish these two methods, reference will be made to UNFOLD-SENSE A and UNFOLD-SENSE B. Both methods were designed for the special case of a reduction factor of four. In UNFOLD-SENSE A, k-space data is undersampled by four along $k_y$, but time-interleaved by starting with phase encode 1, 3, 1, 3 . . . , as compared to 1, 2, 3, 4, 1, 2, 3, 4 . . .

This sampling pattern equivalently moves two of four aliased copies in y-f domain to Nyquist frequency, leaving only two overlapping copies at DC. SENSE with a reduction factor of two is then performed at around DC. SENSE with a reduction factor of four is then performed at all frequencies except around DC and Nyquist frequency, and the spectrum at around the Nyquist frequency is discarded. Data acquisition of UNFOLD-SENSE B is similar to UNFOLD-SENSE A, except that extra PE lines with a lower reduction factor, e.g., two, are acquired in the center of k-space for all the acquisition frames. These center lines are also temporally interleaved. The reconstruction process of UNFOLD-SENSE B is similar to UNFOLD-SENSE A, except that a VD SENSE algorithm (vdSENSE) is used to include central lines of k-space into the SENSE reconstruction. UNFOLD-SENSE B also estimates sensitivity functions based on the low resolution data generated by applying UNFOLD to the central PEs.

In both methods, SENSE and UNFOLD are combined tighter than TSENSE. UNFOLD reduces the reduction factor from four to two at DC and therefore improves conditioning of system matrix, which increases SNR. However, the size of the filter must be carefully chosen to balance the tradeoff between noise and signal loss (which may appear as artifacts). Compounding the difficulty in the filter selection is that the optimal width of the filter is application-dependent. By incorporating center lines into the reconstruction in UNFOLD-SENSE B, low-frequency aliasing artifacts can be reduced. The density compensation filters required for vdSENSE, however, have sharp transitions, which can lead to ringing artifacts in the images. Further, the energy distribution matrix of the present invention, is more smooth and flexible than that achieved with UNFOLD-SENSE. That is, the energy distribution matrix it is estimated directly from the data (or separate training data) and therefore is more accurate than the empirically chosen filtering used in UNFOLD-SENSE. Also, regularization is not included in UNFOLD-SENSE to absorb any prior information. Moreover, it is believed that UNFOLD-SENSE can only achieve a maximum reduction factor of four which limits the applicability of the process.

TGRAPPA uses the same k-t sampling strategy as sliding window. In image reconstruction of TGRAPPA, full-resolution auto-calibration signals (ACS) are first synthesized using sliding window at each temporal frame. Based on the ACS, GRAPPA fitting coefficients are calculated at each frame. Finally, missing lines at each temporal frame are recovered using acquired lines and the GRAPPA coefficients.

The advantage of TGRAPPA is that there is no need to estimate sensitivity functions. However, view-shared ACS lines contain motion-related error, which can first lead to error in GRAPPA fitting coefficients and then translate to motion artifacts in the image. The interleaved sampling pattern is only used to obtain a full set of ACS lines, not to explore spatiotemporal correlation, as is done in the present invention. The reconstruction is typically very slow as well. Images reconstructed according to the invention also have fewer artifacts than those reconstructed using TGRAPPA.

Data acquisition with RIGR is characterized by collecting one or multiple full sets of reference data and a series of low-resolution dynamic data. Each dynamic image is efficiently represented as a generalized series expansion, where the basis functions are complex exponentials contrast-weighted by reference images. At each coil, series coefficients are solved by enforcing data consistency in the center PEs, and weighted images are then reconstructed by evaluating generalized series expansion with the solved series coefficients. Finally, the weighted images are combined using RSOS or a LS estimation.

RIGR can achieve quite high temporal resolution because it only collects a small number of dynamic encodings. RIGR reconstruction is also relatively fast. However, RIGR is a model-based approach with the fundamental assumption that the contrast change (ratio) between reference and dynamic images is of low-resolution, which may approximately hold in some contrast-enhanced applications, e.g., contrast-enhanced neuroimaging, but may not soundly hold in other applications, e.g., imaging of fast-beating heart. When the assumption does not hold, features not captured by the model e.g. new dynamic features and sharp local changes of intensity, are forced to have low spatial resolution and thus could mask diagnostically valuable information.

The ktSENSE method collects two separate data sets: one undersampled, sequentially interleaved data set in an actual scan (same as data acquisition in sliding window), and one low-resolution data set in a separate prescan used to estimate energy distribution of the true image series. The reconstruction can be characterized as an unaliasing process in the y-f domain.

The major differences of ktSENSE and the invention are the following. First, ktSENSE uses temporal average (DC) of the undersampled data as the regularization term, which leads to considerably decreased temporal resolution. This drawback is well-addressed by the present invention with use of a non-static regularization image to generate high temporal resolution images. In one example, RIGR, which produces a high temporal image, is used to generate a regularization image. Second, the training data set in ktSENSE is collected in a separate prescan; therefore, the training data and the actual data must be synchronized. Misregistration due to unsynchronization or motion between the two data sets can introduce additional artifacts in reconstruction. Third, reconstruction of ktSENSE in the y-f domain contains R−1 (R is reduction factor) unrecoverable zero columns because of two reasons. First, in ktSENSE, the difference signal ($\rho_{alias}-S\rho$), where $\rho$ is the unweighted DC image, is approximated by subtracting the weighted DC from the collected data and then transformed to y-f domain, which inevitably produces R zero columns in the y-f domain and is passed to reconstruction through SENSE filtering. It should be noted that this operation can introduce errors because sensitivity weighting and least-squares unweighting (as exemplified in Eqn. 5) are not interchangeable in general. The main reason why this approximation is adopted over direct evaluation of ($\rho_{alias}-S\rho$) in ktSENSE is that estimated sensitivity functions S may introduce even larger errors by direct calculation than the error by the approximation. The present invention obtains better sensitivity functions than ktSENSE because the extra lines collected in the center k-space improves SNR of S. When a sufficient number of temporal frames is collected, e.g. 32, the invention gives sensitivity functions with good SNR, which can be used to directly evaluate the difference signal term. Second, the regularization image in ktSENSE is a DC image, which can only recover the signal at DC in the reconstruction and leave the rest R−1 zero columns unchanged. These zero columns can finally be translated to image artifacts in reconstruction.

Peripheral-gated breathheld cardiac imaging experiments using the present invention were conducted with a GE Signa® EXCITE® 1.5T scanner with eight-channel cardiac array coils. SIGNA and EXCITE are registered trademarks of General Electric Company, Schenectady, N.Y. FIESTA sequence was used to acquire full data set of short-axis images. The remaining parameters were FOV=31 cm×31 cm, matrix size=128×256 (PE×FE), 4 slices, slice thickness=8 mm, 31 cardiac phases/cardiac cycle. The data was then decimated to the desired sampling pattern, which was postprocessed using various reconstruction methods. To eliminate effects on sensitivity estimation error, sensitivity functions were calculated as the temporal average of the fully sampled and sensitivity-weighted images divided by their RSOS image. The phase encoding axis was zero-padded to 256 and Fermi-windowed before Fourier transforming back to image domain.

Using a reduction factor of four, the six proposed techniques described above were compared to the present invention with respect to overall reconstruction performance, temporal evolution of region-of-interest (ROI) pixels, and normalized artifact power. A "true" image sequence was also reconstructed using RSOS on the fully sampled data. The testing showed that the invention generally produces better image quality than RIGR because the SENSE filter in y-f domain can pick up the signal missed by RIGR.

For exemplary cardiac phase reconstructions, an error image was calculated as the difference between reconstruction and true image. Sliding window reconstruction had serious edge-like artifacts, because it had very low temporal resolution and the reconstruction cannot catch up with the heart motion. SENSE had high temporal resolution; the SNR, however, was low due to ill-conditioning. TSENSE improved SNR of SENSE somewhat, but did not yield a high SNR image. SNR of UNFOLD-SENSE was considerably improved over SENSE and TSENSE, but image artifacts were still noticeable, which was mainly due to suboptimal filtering. TGRAPPA generated serious "flickering" artifacts in the reconstructed image. This can be due to both the error introduced by view-shared ACS lines and the error by least-squares fitting. The image from ktSENSE was much higher in SNR than sliding window, SENSE, TSENSE, UNFOLD-SENSE B, and TGRAPPA. However, ktSENSE images had significantly lower temporal resolution than the true image. This was revealed as edge-like artifacts. The present invention, on the other hand, yielded images with high temporal resolution, minimum artifacts, and highest SNR.

To closely compare how various methods are able to track changes over time, which is crucial in dynamic imaging, the average intensity within a 3×3 window at one location of the heart was calculated over time. The results showed that the present invention tracked even sharp changes and had the least error. The other techniques produce noticeable errors. For example, the curve for ktSENSE had large errors at the start and the end of the curve, and locations where sharp transitions occurred.

Figure 9:
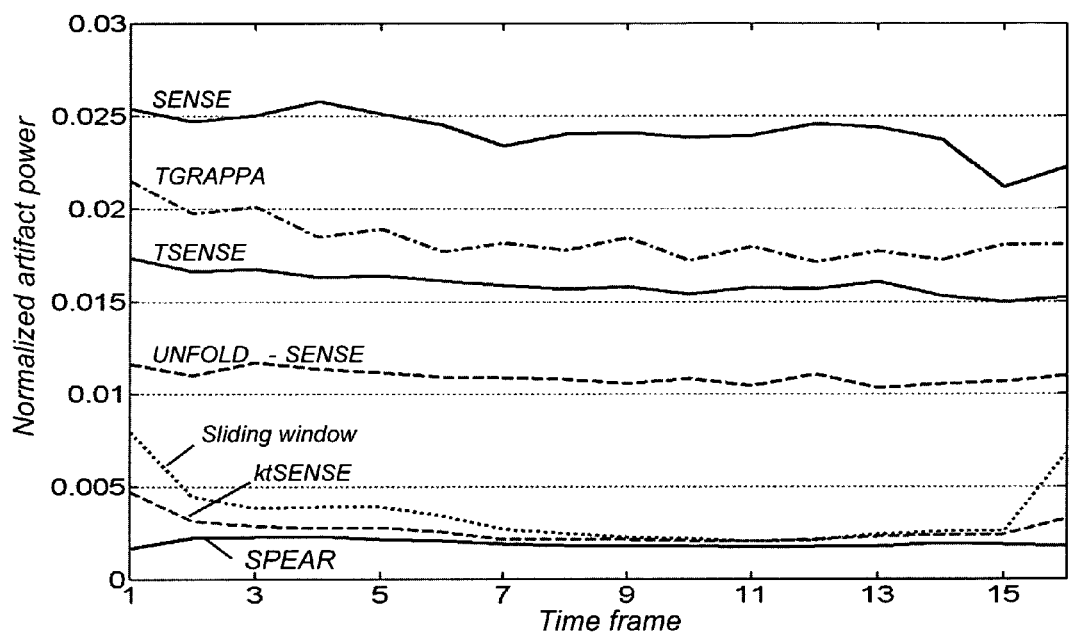
FIG. 9 includes a series of plots for various known dynamic imaging techniques as well as an embodiment of the present invention comparing normalized artifact power with a reduction factor of 4 for each of the identified known dynamic imaging techniques and the dynamic imaging technique of one embodiment of the invention.

Referring now to FIG. 9, to quantify the artifacts (error) created, normalized artifact power for each method was determined. At each time frame, normalized artifact power was defined by the sum-of-squares of all pixels in an error image divided by a sum-of-squares of all pixels in a true image. SENSE had the largest artifact power because of noise amplification. TGRAPPA had the second largest artifact power because of misfitting and error from ACS lines. TSENSE and UNFOLD-SENSE had reduced noise over SENSE. Artifact power of sliding window was relatively low. Reconstructions of ktSENSE and the present invention, SPEAR (SPatiotemporal domain-based unaliasing Employing Adaptive Regularization), had lower artifact power, with the present invention having the lowest. Also, the invention had much lower artifact power at near start and end of the image series.

Reconstructions from ktSENSE and the invention were compared at one phase at systole and one phase at diastole. Noticeable image artifacts were found to exist in both systole and diastole images from ktSENSE, whereas these artifacts were significantly suppressed by the present invention.

Profiles on y-t domain at different slice locations were generated to compare temporal resolution of ktSENSE and the invention to true profiles. The images revealed that none of three sharp changes in the true profile were imaged by the ktSENSE reconstruction, while all were well reconstructed by the invention. A sharp intensity change at the beginning of the series at the ventricular wall was not shown in ktSENSE, whereas it was well reconstructed by the invention. Furthermore, ktSENSE reconstruction falsely had a sharp change due to loss of phase information in the energy distribution estimator and the zero columns in y-f domain. In contrast, reconstructions with the present invention had high fidelity with the true profile.

Profiles on y-f domain, were compared for a ktSENSE reconstruction, a present invention reconstruction, and a true signal reconstruction. The profile for ktSENSE had seven zero columns that were recovered. These zero columns resulted in a serious signal loss, as compared to the true profile. In contrast, the invention present recovered all the columns and had very high fidelity with the true profile.

The extra center PEs that are acquired without undersampling effectively decrease the temporal resolution; however, the extra PEs can give a misregistration-free energy distribution matrix and high temporal-resolution regularization images, which significantly improve image quality.

Further, as described, two fully-sampled reference images are acquired. When intense motion exists at the beginning or end of the series, it is contemplated that gating may be used to prevent reference images from blurring. However, gating is not required when the start and the end of the acquisition series are relatively still, e.g., pre- and post-contrast frames in contrast-enhanced neuroimaging.

As set forth above, the present invention is applicable with 2D as well as 3D imaging. Application to 2D imaging has been heretofore described, but a skilled artisan will readily appreciate that the invention can be extended to 3D imaging. In this regard, it is contemplated that 3D imaging may be accomplished in two general techniques. In one technique, the same 2D acquisition (described above) is applied to ($k_x$, $k_y$,t) space at each $k_z$ location. Image reconstruction of this technique involves an inverse FT along $k_z$ followed by 2D reconstruction algorithm (described above) at each z. In the other technique, $k_y$ undersampling is interleaved along both t and $k_z$ axes. Image reconstruction of this techniques involves y-z-f domain unaliasing (similar to y-f domain unaliasing described above) at each (y,z,f). When SNR permits, both techniques can be combined with $k_z$ undersampling to further improve temporal resolution.

Therefore, a method of dynamic MR imaging is disclosed that includes the step of acquiring frames of MR data containing dynamic imaging data and reference data with an array of receive coils. The method further includes the step of generating a non-static regularization image with a regularization reconstruction from the reference data and selected portions of the dynamic imaging data. An image is then reconstructed from the dynamic imaging data with a parallel imaging reconstruction using the non-static regularization image to improve spatiotemporal resolution of the reconstructed image.

The invention also includes a computer readable storage medium having a computer program stored thereon to reconstruct an MR image. The computer program represents a set of instructions that when executed by a computer causes the computer to decompose the VD, sequentially-interleaved data with references into a plurality of sets. The set of instructions further causes the computer to generate a coil sensitivity image from a first set of data and generate a non-static regularization image with a second set of data and the coil sensitivity image. The computer is further caused to determine an energy distribution of true signal for unaliasing in a y-f domain from a third set of data and the non-static regularization image.

An MR imaging apparatus is also disclosed as having a plurality of gradient coils positioned about a bore of a magnet configured to impress a polarizing magnetic field and a RF receiver system in an RF switch controlled by a pulse module to transmit RF coils to an RF coil assembly to acquire MR images. The apparatus further includes a computer that is programmed to sample frames of MR data acquired over time with the RF coil assembly and generate a $k_x,k_y,t$ space from the sampled frames. The computer is also programmed to generate a RIGR regularization image from the $k_x,k_y,t$ space and reconstruct an image with high spaciotemporal resolution from the frames of MR data with a ktSENSE reconstruction using the RIGR regularization image.

The present invention has been described in terms of the preferred embodiment, and it is recognized that equivalents, alternatives, and modifications, aside from those expressly stated, are possible and within the scope of the appending claims.

What is claimed is:

1. A method of dynamic MR imaging comprising the steps of:
   acquiring a sequence of MR data containing dynamic imaging data and reference data with an array of receive coils;
   generating a regularization image adaptively at each time point with a generalized series model using the reference data and selected portions of the dynamic imaging data; and
   reconstructing an image from the dynamic imaging data with regularized imaging reconstruction using the adaptively-reconstructed sequence of regularization images.

2. The method of claim 1 wherein the data acquisition step includes collecting the frames of MR data with a variable density (VD), sequentially-interleaved sampling pattern.

3. The method of claim 2 wherein the VD, sequentially-interleaved sampling pattern includes acquisition of a first and a last temporal frame, both of which are fully sampled, and a sequence of intermediate temporal frames between the first and the last temporal frames, the sequence of intermediate temporal frames being partially undersampled.

4. The method of claim 3 further comprising the steps of:
   segmenting each intermediate temporal frame into a central phase encoding segment and an outer phase encoding segment;
   sampling the central phase encoding segment without undersampling; and
   sampling the outer phase encoding segment with undersampling.

5. The method of claim 3 further comprising the steps of decomposing the frames of MR data into an unaliasing set, a regularization set, and an energy distribution estimate set.

6. The method of claim 5 further comprising the steps of:
   forming the unliasing set from a sequentially interleaved pattern for all phase encodings;
   forming the regularization set from phase encodings of the first and the last temporal frames and phase encodings from a central phase encoding segment of the plurality of intermediate temporal frames; and
   forming the energy distribution estimate set from the central phase encoding segment of the plurality of intermediate temporal frames.

7. The method of claim 1 wherein the regularization reconstruction is a RIGR reconstruction and the parallel imaging reconstruction is ktSENSE.

8. A computer readable storage medium having a computer program stored thereon to reconstruct an MR image and representing a set of instructions that when executed by a computer causes the computer to:
   decompose variable-density (VD), sequentially-interleaved data with references into a plurality of sets;
   generate a coil sensitivity image from a first set of data;
   generate a non-static regularization image from a second set of data and the coil sensitivity image; and
   determine an energy distribution of true signal for unaliasing in a y-f domain from a third set of data and the non-static regularization image.

9. The computer readable storage medium of claim 8 wherein the non-static regularization image is RIGR regularization image and where in set of instructions further causes the computer to perform y-f domain ktSENSE reconstruction with regularization of the VD, sequentially interleaved data with references using the energy distribution of true signal for image unaliasing.

10. The computer readable storage medium of claim 9 wherein VD, sequentially interleaved data with references includes two reference temporal frames of fully sampled phase encodings and a plurality of intermediate temporal frames with partially undersampled phase encodings.

11. The computer readable storage medium of claim 10 wherein the set of instructions further causes the computer to generate a $k_x,k_y,t$ space from phase encodings of the two reference temporal frames and phase encodings of the plurality of intermediate temporal frames.

12. The computer readable storage medium of claim 11 wherein the first set of data comprises data from interleaved phase encodings of the $k_x,k_y,t$ space.

13. The computer readable storage medium of claim 11 wherein the second set of data comprises data from phase encodings of the two reference frames and central phase encodings of the plurality of intermediate temporal frames.

14. The computer readable storage medium of claim 11 wherein the third set of data comprises data from central phase encodings of the plurality of intermediate temporal frames.

15. The computer readable storage medium of claim 11 wherein the first set of data includes undersampled $k_y$-t space and wherein the set of instructions further causes the computer to zero-fill unsampled portions of the undersampled $k_y$-t space.

16. A magnetic resonance (MR) imaging apparatus comprising:
   a plurality of gradient coils positioned about a bore of a magnet to impress a polarizing magnetic field, and an RF transceiver system and an RF switch controlled by a pulse module to transmit RF signals to an RF coil assembly to acquire MR images; and
   a computer programmed to:
      sample frames of MR data acquired over time with the RF coil assembly;
      generate a $k_x,k_y,t$ space from the sampled frames;
      generate a RIGR regularization image from the $k_x,k_y,t$ space; and
      reconstruct an image with high spatiotemporal resolution from the frames of MR data with a ktSENSE reconstruction using the RIGR regularization image.

17. The MR apparatus of claim 16 wherein the frames include a pair of reference frames that bookend a plurality of dynamic frames and wherein the computer is further programmed to acquire the dynamic frames of MR data with a variable density, sequentially-interleaved acquisition in a phase encoding direction.

18. The MR apparatus of claim 17 wherein the computer is further programmed to acquire the pair of reference frames with full sampling in the phase encoding direction.

19. The MR apparatus of claim 16 wherein the computer is further configured to acquire the MR data with a 3D pulse sequence.

20. The MR apparatus of claim 16 wherein the computer is further configured to acquire the MR data with a 2D pulse sequence.

* * * * *

UNITED STATES PATENT AND TRADEMARK OFFICE
CERTIFICATE OF CORRECTION

| | | |
|---|---|---|
| PATENT NO. | : 7,592,809 B1 | Page 1 of 1 |
| APPLICATION NO. | : 11/287184 | |
| DATED | : September 22, 2009 | |
| INVENTOR(S) | : King et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 973 days.

Signed and Sealed this

Twenty-first Day of September, 2010

David J. Kappos
*Director of the United States Patent and Trademark Office*